United States Patent [19]

Sher

[11] Patent Number: 5,555,166
[45] Date of Patent: Sep. 10, 1996

[54] SELF-TIMING POWER-UP CIRCUIT

[75] Inventor: Joseph C. Sher, Boise, Id.

[73] Assignee: Micron Technology, Inc., Boise, Id.

[21] Appl. No.: 468,105

[22] Filed: Jun. 6, 1995

[51] Int. Cl.$^6$ .............................. H02M 7/10; H03K 3/01
[52] U.S. Cl. ................................. 363/49; 327/544
[58] Field of Search ............................. 363/49; 323/282, 323/283, 284; 327/392, 393, 394, 535, 544, 545

[56] References Cited

U.S. PATENT DOCUMENTS

| | | | |
|---|---|---|---|
| H497 | 7/1988 | Piasecki | 307/594 |
| 4,948,995 | 8/1990 | Takahashi | 3007/594 |
| 4,970,408 | 11/1990 | Hanke et al. | 307/272.3 |
| 4,983,857 | 1/1991 | Steele | 307/272.3 |
| 5,073,850 | 12/1991 | Pace | 363/49 |
| 5,172,012 | 12/1992 | Ueda | 307/272.3 |
| 5,204,558 | 4/1993 | Kumaki et al. | 327/544 |
| 5,243,231 | 9/1993 | Baik | 327/544 |
| 5,250,853 | 10/1993 | Bacigalupo | 327/394 |
| 5,323,067 | 6/1994 | Shay | 307/272.3 |
| 5,471,130 | 11/1995 | Agiman | 323/284 |
| 5,479,333 | 12/1995 | McCambridge et al. | 363/49 |

FOREIGN PATENT DOCUMENTS

| | | | |
|---|---|---|---|
| 0333405 | 9/1989 | European Pat. Off. | H03K 17/22 |
| 63-266921 | 4/1988 | Japan | H03K 17/22 |
| 6097796 | 8/1994 | Japan | H03K 17/22 |
| 2059707 | 4/1981 | United Kingdom | H03K 17/22 |

*Primary Examiner*—Matthew V. Nguyen
*Attorney, Agent, or Firm*—Seed and Berry

[57] ABSTRACT

An improved power-up circuit formed in an integrated circuit for generating a power-up pulse for integrated circuit devices. The present invention includes an input stage, an output stage, and a pulse control circuit. The input stage receives a supply voltage rising from a reference ground to a steady supply voltage upon power-up. The input stage generates a logic low state for a selected period of time, and a logic high state thereafter. An output stage is connected to the input stage, and generates a logic high state when the input stage is generating the logic low state. The output stage switches to the logic low state when the input stage switches to the logic high state after the selected time period. The logic high and low states sequentially generated by the output stage define the power-up pulse. The pulse control circuit is connected between the input and output of the output stage for controlling the width of the power-up pulse. When the output of the output stage switches to the logic high state, the pulse control circuit prevents the output stage from switching to the logic low state for a selected delay period to ensure a minimum width for the generated power-up pulse. Hence, the power-up circuit consistently produces a proper power-up pulse regardless of the ramp-up rate of the supply voltage and power glitches associated with the supply voltage.

15 Claims, 3 Drawing Sheets

SELF-TIMING POWER-UP CIRCUIT

TECHNICAL FIELD

This invention relates to integrated circuit devices, and more particularly, to a power-up circuit formed in the integrated circuit devices.

BACKGROUND OF THE INVENTION

Power-up circuits formed in an integrated circuit chip for providing a power-up pulse to the same chip or other integrated circuit chips are well-known in the art. One type of a power-up circuit includes a resistor and a capacitor connected in series to a supply voltage with the junction between the resistor and capacitor connected to the input of an inverter. When power is first applied to the power-up circuit, the capacitor starts to charge. While charging, the inverter outputs a logic high state. When the capacitor is sufficiently charged to produce a logic high state, the output of the inverter switches to a logic low state. The sequentially generated logic high and low states define a power-up pulse for driving the integrated circuit chips.

One disadvantage of the prior art power-up circuit is that when the supply voltage ramps up relatively slowly compared with the charging rate of the capacitor, the output of the capacitor tracks the supply voltage, and the output of the power-up circuit always stays at the logic low state. As a result, no pulse is produced, and power-up failure occurs. To ensure a proper power-up pulse over a wider range of the ramp-up rate of the supply voltage, larger capacitors have been used in power-up circuits. This, however, has created a problem under multiple power-up and power-down situations within a short period of time. Specifically, since the larger capacitor discharges very slowly, it may be only partially discharged. As a result, no power-up pulse is generated from the second power-up. Another disadvantage is that the prior art power-up circuit is highly susceptible to noise on the supply voltage. As is well-known in the art, the supply voltage level upon power-up is prone to power glitches as it rises from a reference ground to a steady supply voltage. These power glitches may cause no pulse or multiple pulses to be generated, both of which may result in a power-up failure.

It is therefore desirable to provide a power-up circuit that consistently produces a proper power-up pulse regardless of the ramp-up rate of, and power glitches on the supply voltage. It is also desirable to provide the power-up circuitry with a fast reset capability to provide the necessary power-up pulses under multiple power-up and power-down situations within a short period of time.

SUMMARY OF THE INVENTION

According to principles of the present invention, an improved power-up circuit is formed in an integrated circuit for generating a power-up pulse for integrated circuit devices. The present invention includes an input stage, an output stage, and a pulse control circuit. The input stage receives a supply voltage rising from a reference ground to a steady supply voltage upon power-up. The input stage generates a logic low state for a selected period of time, and a logic high state thereafter. An output stage is connected to the input stage, and generates a logic high state when the input stage is generating the logic low state. The output stage switches to the logic low state when the input stage switches to the logic high state after the selected time period. The logic high and low states sequentially generated by the output stage define the power-up pulse. The pulse control circuit is connected between the input and output of the output stage for controlling the width of the power-up pulse. When the output of the output stage switches to the logic high state, the pulse control circuit prevents the output stage from switching to the logic low state for a selected delay period to ensure a minimum width for the generated power-up pulse.

DETAILED DESCRIPTION OF THE INVENTION

Figure 1:
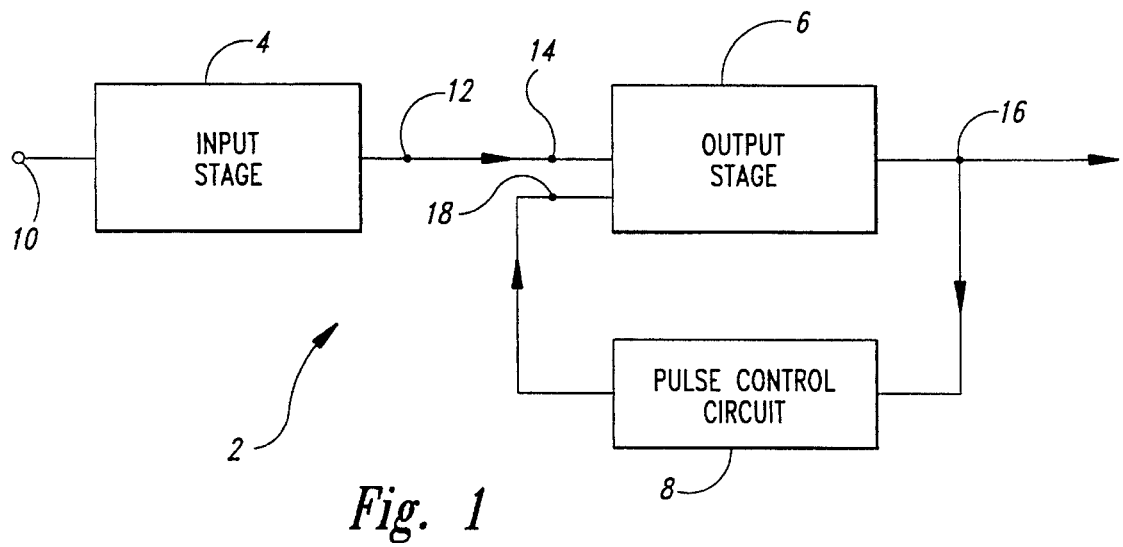
FIG. 1 is a block diagram of a power-up circuit according to the present invention.

FIG. 1 is a block diagram of a power-up circuit 2 according to the present invention. An input stage 4 receives at its input 10 a power supply voltage $V_{cc}$ which ramps up or rises from a reference ground to a steady supply voltage $V_{cc}$ upon a power-up. Based on the rise time of the supply voltage $V_{cc}$, the input stage 4 generates at its output 12 a logic low signal for a selected time period. After the selected time period, the output switches to a logic high state. The output 12 of the input stage 4 is connected to an input 14 of an output stage 6 which generates at its output 16 a logic signal opposite to that received from the input stage 4. Thus, when the input stage 4 is generating a logic low state at its output 12, the output stage 6 generates a logic high state to create a leading edge of a power-up pulse. When the input stage 4 switches to the logic high state after the selected time period, the output stage 6 switches to the logic low state to create the trailing edge of the power-up pulse. The power-up circuit also includes a pulse control circuit 8 connected between another input 18 and the output 16 of the output stage 6 which controls the width of the power-up pulse. Once the output 16 of the output stage 6 is at the logic high state, the pulse control circuit 8 prevents the output 16 from switching to a logic low state for a selected delay period to ensure a minimum width of the power-up pulse required by the circuit device (not shown) being driven.

Figure 2:
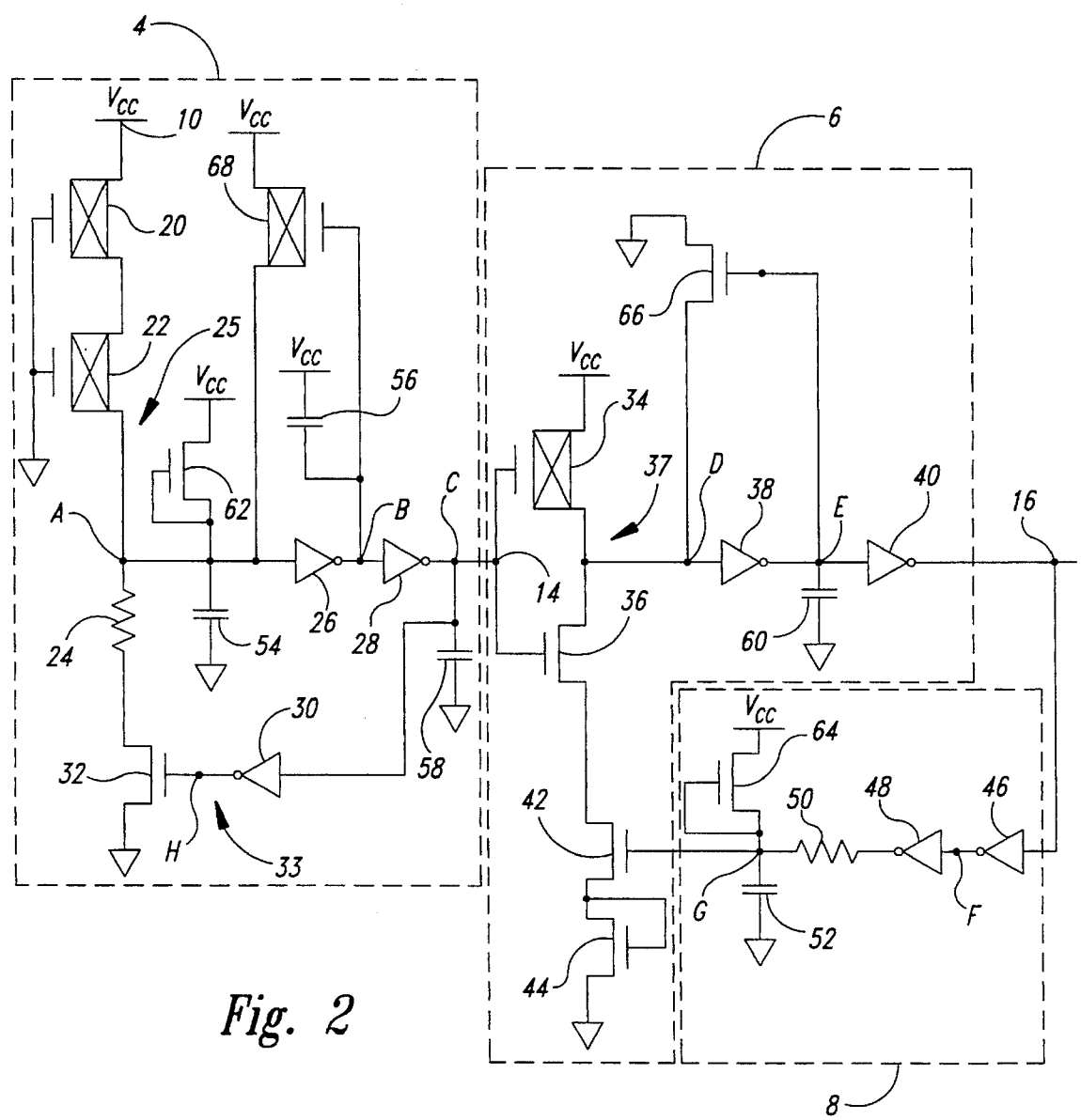
FIG. 2 is a detailed schematic diagram of a preferred embodiment of the circuit of FIG. 1.

FIG. 2 is a detailed schematic diagram of a preferred embodiment of the circuit of FIG. 1. The input stage 4 has an input 10 for receiving an external power supply voltage $V_{cc}$. A pair of PMOS transistors 20–22 are connected in series with each other. The transistors 20–22 are long channel devices so that they essentially act as resistors. The transistors 20–22 and a resistor 24 act as a voltage divider 25 which produces at node A a divided voltage that is a fraction of the supply voltage $V_{cc}$. A pair of inverters 26–28 act as delay elements for delaying the propagation of the logic state at node A. An inverter 30 and an NMOS transistor 32 comprise an isolating circuit 33 for electrically isolating the voltage divider 25 from the reference ground when node C is at logic high. As explained further below, the isolating circuit 33 minimizes a current drain through the voltage divider 25. Capacitors 54 and 58 are connected between the respective nodes A and C, and the reference ground to place nodes A and C at their proper initial states of 0 volts. A capacitor 56 connects node B to the supply voltage $V_{cc}$ to quickly pull up node B to a logic high as $V_{cc}$ rises.

In operation upon a power-up, the capacitor 54 charges through the transistors 20–22. When the voltage on the capacitor 54 reaches a logic high state, the output of the inverter 26 goes low, thereby turning on the transistor 68. The transistor 68 then latches the input to the inverter 26 at logic high to make the inverter 26 less sensitive to noise or power glitches. The logic low at the output of the inverter 26 then causes the output of the inverter 28 to go to logic high. A transistor 62 connected to node A operates as a diode, and provides a discharge path to the reference ground for the capacitor 54 when power is removed and $V_{cc}$ falls to 0 volts. The transistor 62 quickly resets the power-up circuit to provide a power-up pulse under multiple power-up and power-down situations. Thus, in operation, the output of the inverter 28 is initially at logic low at power-up, but a short time thereafter determined primarily by the rise time of the supply voltage $V_{cc}$, the capacitor 54, the resistor 24, and the resistance of the transistors 20–22 and 32, the output of the inverter 28 goes to logic high. The logic high at the output of the inverter 28 after power-up is inverted by the inverter 30 to turn off the transistor 32. The transistor 32 then terminates the flow of current through the voltage divider 25. The isolating circuit 33 thus prevents power from being wasted in the voltage divider 25 after power-up.

The output stage 6 is connected to the output of the input stage 4. A PMOS transistor 34 and an NMOS transistor 36 are configured as an inverter. Inverters 38 and 40 act as delay elements for delaying the propagation of the logic state at node D. Since there are three inverters 37–40 between node C and the output 16, the output produces an opposite logic state from the logic state at node C of the input stage 4. When the supply voltage $V_{cc}$ initially rises from the reference ground, node C is at logic low which turns on the transistor 34, and turns off the transistor 36. This results in a logic high at node D, and after a delay of two inverters 38 and 40, causes a logic high at the output 16 to create the leading edge of the power-up pulse. A capacitor 60 holds node E at its initial value of logic low. When the logic state at node C switches to a logic high after a selected time period, the transistor 34 turns off, and the transistor 36 turns on. The logic low state at node D causes node E to switch to a logic high state, and the output 16 to switch to a logic low state to create the trailing edge of the power-up pulse. As explained below with reference to the pulse control circuit 8, at the end of the power-up pulse, an NMOS transistor 42 is turned off. As a result, the logic high on node C cannot cause the transistor 36 to maintain node D at logic low. In order to prevent node D from floating after the power-up pulse has been produced, an NMOS transistor 66 connected between node D and the reference ground is turned on when node E goes high after the power-up pulse is generated and the output 16 is maintained at the logic low state.

The pulse control circuit 8 connects the output node 16 to a second input 18 of the output stage 6, and controls the width of the power-up pulse. The pulse control circuit 8 includes a pair of inverters 46–48, and an R-C network 50–52 which produces the time delay necessary to ensure a minimal pulse width. In an alternative embodiment, a counter may be used as the delay circuit instead of the R-C network 52–52. When the output 16 switches to logic high and creates the leading edge of the power-up pulse, the pulse control circuit 8 maintains that logic high state at the output 16 for a selected delay period regardless of the logic state at node C. More specifically, the power-up pulse cannot terminate with the output 16 going low until the logic high on node C is able to create a path to ground from node D through the transistors 36, 42 and 44. Thus, a logic high on node C cannot create a path from node D to the reference ground until the transistor 42 turns on. At the leading edge of the power-up pulse, the node G will be held at logic low through the capacitor 52. However, the power-up pulse at the output 16 will produce a logic high at the output of the inverter 48 that will charge the capacitor 52 through the resistor 50. When the capacitor 52 has been charged to a predetermined voltage, the transistor 42 will turn on. The time required for the transistor 42 to turn on is a function of the rise time of the external supply voltage $V_{cc}$, and the time constant of the resistor 50 and the capacitor 52 as well as the predetermined voltage at which the transistor 42 turns on. An NMOS transistor 44 connected to the transistor 42 is configured as a diode to raise the predetermined voltage level required to turn on the transistor 42. Thus, for a given rise time of the external supply voltage $V_{cc}$, a predetermined time after the leading edge of the power-up pulse from the output 16, the transistor 42 turns on. If node C has already switched to logic high during the delay period as may be the case with a relatively slow rise time of the external supply voltage $V_{cc}$, transistor 36 turns on, and node D is pulled to the reference ground through the transistors 36, 42, and 44. Accordingly, the output 16 switches to logic low to create the trailing edge of the power-up pulse after the delay period. If node C is still at logic low after the delay period as may be the case with a relatively fast rise time for the external supply voltage $V_{cc}$, the output 16 switches to logic low when node C switches to logic high. Thus, the pulse control circuit 8 effectively locks the output 16 of the output stage 6 at logic high for the delay period to ensure a minimum width for the power-up pulse required by the circuit device (not shown) being driven.

As with the transistor 62, an NMOS transistor 64 is configured as a diode to bleed the charge stored in the capacitor 52 upon a power-down of the power-up circuit. The transistor 64 quickly resets the power-up circuit to provide the necessary pulse under multiple power-up and power down situations.

Figure 3:
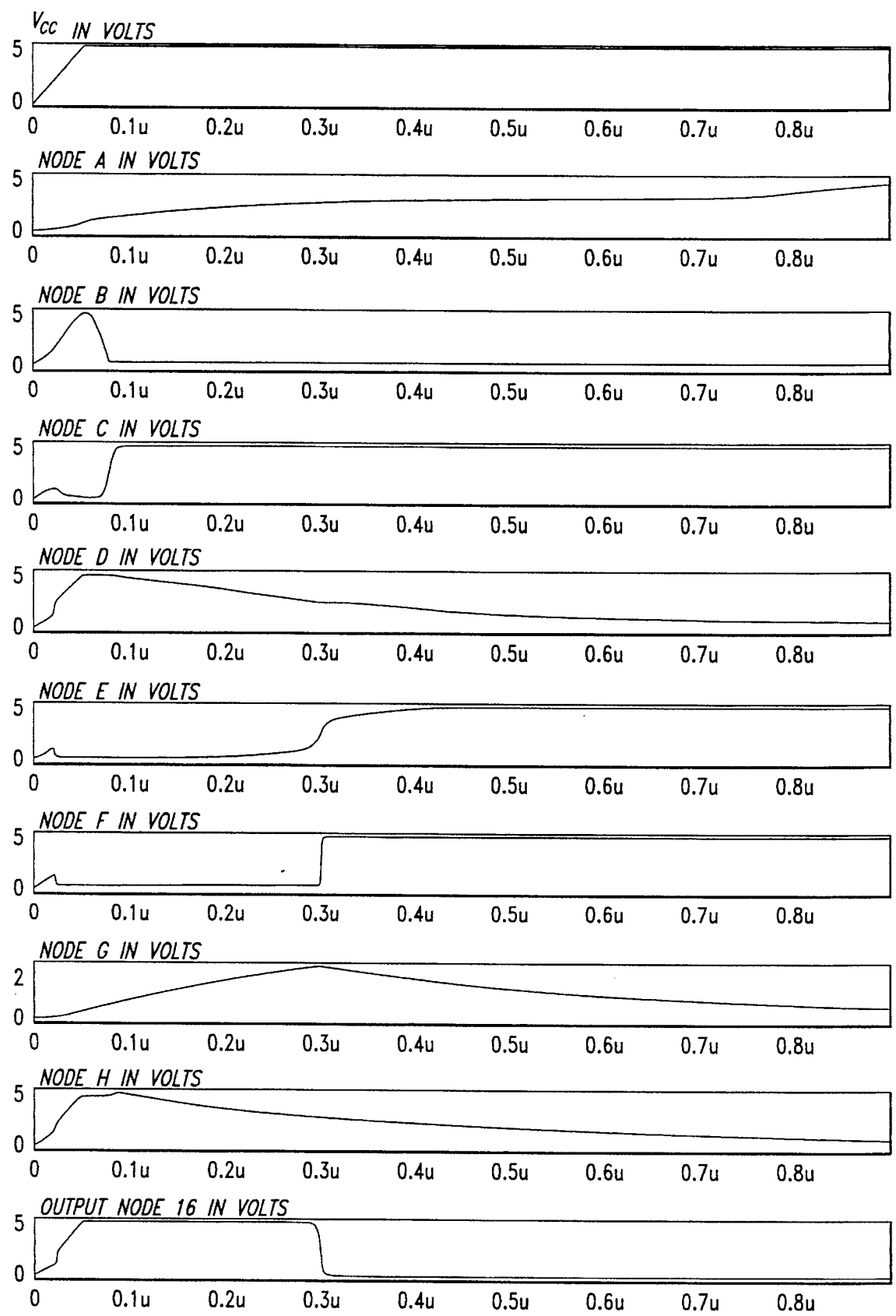
FIG. 3 is a graph of the voltage levels of various nodes on the circuit of FIG. 2 with a 50 nanosecond rise time of the supply voltage.

FIG. 3 is a graph of the voltage levels of various nodes on the circuit of FIG. 2 with a 50 nanosecond rise time of the supply voltage $V_{cc}$. Upon a power-up, the external power supply voltage $V_{cc}$ rises from zero volts to 5 volts in relatively fast 50 nanoseconds. Node A follows the supply voltage ramp at a slower rate. This causes node B to switch to logic high, and node C to logic low. At approximately 70 nanoseconds, the rising voltage level at node A switches node B to logic low, and node C to logic high. At approximately 25 nanoseconds, logic low at node C causes the output 16 to switch to logic high to produce the leading of the power-up pulse. After a delay of two inverters 46–48, the voltage level at node G starts to rise due to charging of the capacitor 52. While the capacitor 52 is charging, node C switches to logic high at approximately 80 nanoseconds. Due to the off state of the transistor 42, however, node D is prevented from switching to logic low. When the capacitor 52 is sufficiently charged after a selected delay period, it turns on the transistor 42 at approximately 290 nanoseconds. At that time, node D switches to logic low, and node E to logic high. This causes the output 16 to switch to logic low to produce the trailing edge of the power-up pulse.

Figure 4:
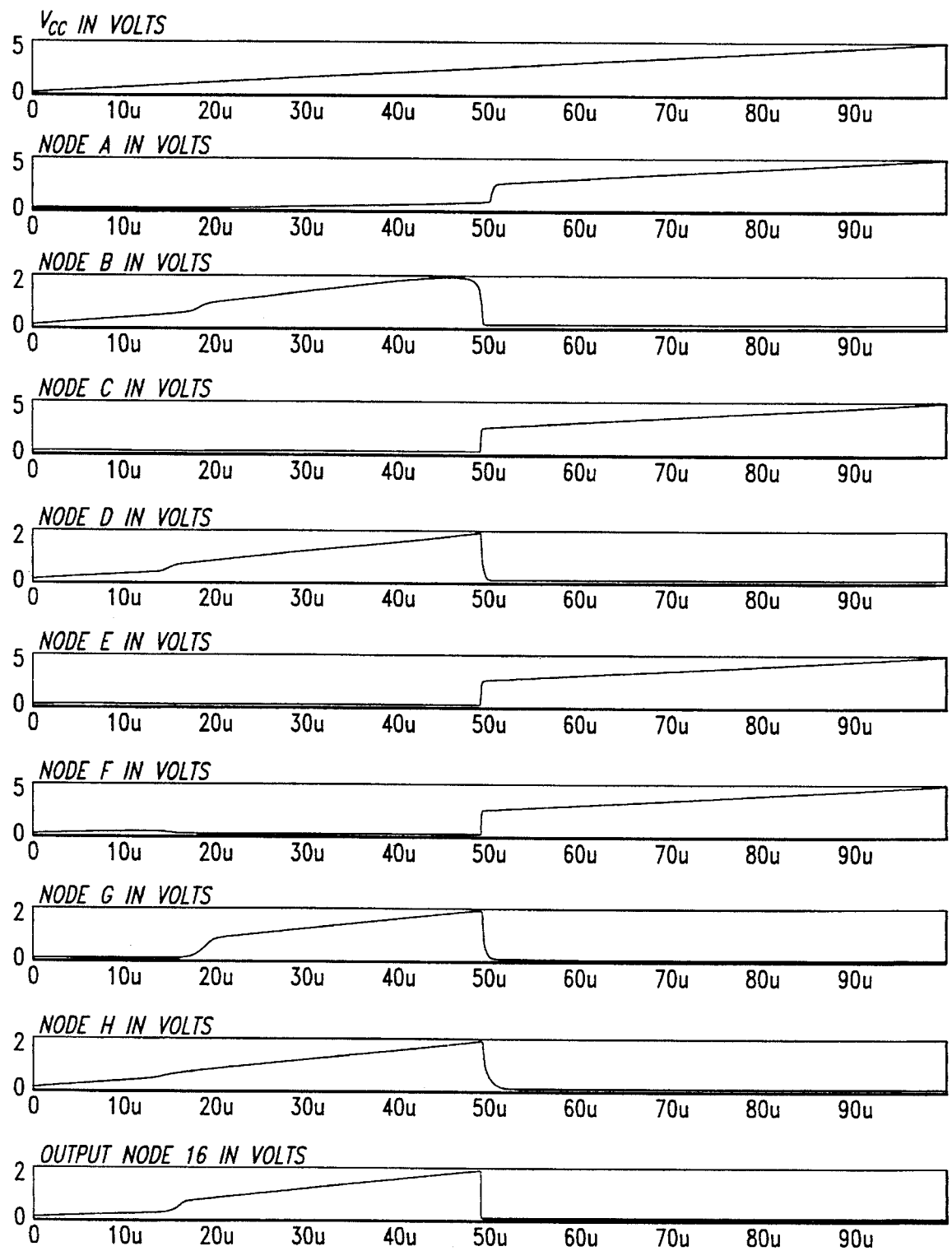
FIG. 4 is a graph of the voltage levels of various nodes on the circuit of FIG. 2 with a 100 microsecond rise time of the supply voltage.

FIG. 4 is a graph of the voltage levels of various nodes on the circuit of FIG. 2 with a 100 microsecond rise time of the supply voltage $V_{cc}$. Upon power-up, the external power supply voltage $V_{cc}$ rises from zero volts to 5 volts in relatively slow 100 microseconds. As in FIG. 3, node A follows the supply voltage ramp at a slower rate. This causes node B to switch to logic high, and node C to logic low. When node C is at logic low, node D is at logic high, and node E at logic low. At approximately 15 microseconds, the output 16 switches to logic high to produce the leading edge of the power-up pulse. After a delay of two inverters 46–48, the voltage level at node G starts to rise due to charging of the capacitor 52. When the capacitor 52 is sufficiently charged, it turns on the transistor 42 at approximately 40 microseconds. At that time, node C is still at logic low. At approximately 49 microseconds, the rising voltage level at node A switches node B to logic low, and node C to logic high. Once node C switches to logic high, node D switches to logic low, and node E to logic high. This causes the output 16 to switch to logic low to produce the trailing edge of the power-up pulse. The logic high state at node C also produces a logic low at node H through the inverter 30. This causes the transistor 32 to turn off and cuts off the voltage divider 25 from the reference ground to minimize a flow of current through the voltage divider 25.

As can be seen from FIGS. 1–4, a timing delay period is taken from the output 16 of the output stage 6 to control its own input to ensure that upon a power-up, the output 16 of the output stage 6 produces a logic high state of a predetermined minimum duration before producing a logic low state. Hence, the power-up circuit according to principles of the present invention consistently produces a proper power-up pulse regardless of the ramp-up rate of the supply voltage $V_{cc}$ and power glitches associated with the supply voltage. The power-up circuit may be easily modified to provide a power-up pulse of any desired height and width. The width of the power-up pulse may be adjusted by varying the value of the resistor 50 or the capacitor 52. The pulse height may be adjusted by either changing file threshold value of the transistor 44, or by varying the sizes of the transistors 20–22, or the resistance of the resistor 24.

The foregoing specific embodiments represent just some of the ways of practicing the present invention. Many other embodiments are possible within the spirit of the invention. Accordingly, the scope of the invention is not limited to the foregoing specification, but instead is given by the appended claims along with their full range of equivalents.

I claim:

1. A power-up circuit formed in an integrated circuit for generating a power-up pulse for a semiconductor circuit device based on a supply voltage rising from a reference potential to a steady supply voltage, comprising:

an input stage having an output and an input adapted to receive the supply voltage, the input stage generating at the output a first logic state for a selected time period after receipt of the supply voltage, and a second logic state thereafter;

an output stage having a first input connected to the output of the input stage, a second input, and an output, the output stage generating one logic state when the first input is at the first logic state, and switching to another logic state when the first input is at the second logic state and the second input is at a predetermined logic state, the logic states sequentially generated by the output stage defining the power-up pulse; and a pulse control circuit connected between the second input and the output of the output stage, the pulse control circuit generating the predetermined logic state after at least a preset delay period after the output of the output stage switches to the one logic state at the start of the power-up pulse whereby the pulse control circuit prevents the output of the output stage from switching to the another logic state from the one logic state for at least the preset delay period to ensure a minimum width for the generated power-up pulse.

2. The power-up circuit according to claim 1 wherein the pulse control circuit comprises a counter for producing the preset delay period.

3. The power-up circuit according to claim 1 wherein the pulse control circuit comprises a R-C circuit for producing the preset delay period.

4. The power-up circuit according to claim 1 wherein the pulse control circuit comprises:

a R-C circuit for producing the preset delay period; and a bleeder circuit connected to the R-C circuit for discharging the charge stored in the R-C circuit upon a power-down of the power-up circuit.

5. The power-up circuit according to claim 1 wherein the output stage comprises an inverter having an input connected to the output of the input stage.

6. The power-up circuit according to claim 1 wherein the output stage comprises:

an inverter having an input connected to the output of the input stage; and a switch connected in series between the inverter and the reference potential, the switch for isolating the inverter from the reference potential during the preset delay period and connecting the inverter to the reference potential when the predetermined logic state is generated.

7. The power-up circuit according to claim 1 wherein the input stage comprises a voltage divider connected at the input for providing the input stage with a divided supply voltage.

8. The power-up circuit according to claim 1 wherein the input stage comprises:

a voltage divider connected at the input for providing the input stage with a divided supply voltage; and an isolating circuit for isolating the voltage divider from the reference potential to minimize a flow of current through the voltage divider when the output of the input stage is maintained at the second logic state.

9. The power-up circuit according to claim 1 wherein the input stage comprises:

a voltage divider connected at the input for providing the input stage with a divided supply voltage;

a first inverter adapted to receive the divided supply voltage; and a second inverter connected in series with the first inverter.

10. The power-up circuit according to claim 1 wherein the input stage comprises:

a voltage divider connected at the input for providing the input stage with a divided supply voltage;

a first inverter adapted to receive the divided supply voltage;

a second inverter connected in series with the first inverter; and a latch circuit connected in parallel with the first inverter, the latch circuit for holding an output of the first inverter at the first logic state during a power glitch on the supply voltage.

11. A power-up circuit formed in an integrated circuit for generating a power-up pulse for a circuit device based on a supply voltage rising from a reference potential to a steady supply voltage, comprising:

an input stage having an output, and an input for receiving the supply voltage, the input stage generating at the output a first logic state for a selected time period, and a second logic state thereafter;

an output stage having a first input coupled to the output of the input stage, a second input, and an output, the output stage generating the second logic state when the first input is at the first logic state, and switching to the first logic state when the first input is at the second logic state and the second input is at a predetermined logic state, wherein the second and first logic states sequentially generated by the output stage define the power-up pulse; and a pulse control circuit having an input coupled to the output of the output stage and an output coupled to the second input, the pulse control circuit holding the output of the output stage at the second logic state for a selected delay period regardless of the logic state at the first input, and generating the predetermined logic state at the second input after the selected delay period to ensure a minimum width for the generated power-up pulse.

12. A method of generating a power-up pulse responsive to a supply voltage rising from a reference potential to a steady supply voltage, comprising:

generating a first signal having a first logic level a first preset time after the supply voltage is received;

generating the leading edge of the power-up pulse responsive to receipt of the supply voltage;

generating a second signal having a second logic level a second preset time after the leading edge of the power-up pulse is generated; and generating the trailing edge of the power-up pulse upon the first signal having the first logic level and the second signal having the second logic level so that the power-up pulse has a minimum duration of the second preset time.

13. The method according to claim 12, further including the step of preventing the first signal from generating the trailing edge of the power-up pulse during the second preset time if the first logic level is present during the second preset time.

14. The method according to claim 12 wherein the first signal is generated by an input circuit, and wherein the method further includes the step of disabling at least part of the input circuit responsive to the first logic level thereby reducing the power consumed by the input circuit after the first logic level has been generated.

15. The method according to claim 12 wherein the first and second logic levels are voltages of substantially the same magnitude.

* * * * *